United States Patent
Jiang

(10) Patent No.: US 11,646,096 B1
(45) Date of Patent: May 9, 2023

(54) METHOD AND APPARATUS FOR ACCESSING MEMORY, MEMORY, STORAGE DEVICE AND STORAGE MEDIUM

(71) Applicant: CHANGXIN MEMORY TECHNOLOGIES, INC., Hefei (CN)

(72) Inventor: Xiangqian Jiang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/659,631

(22) Filed: Apr. 18, 2022

(30) Foreign Application Priority Data

Dec. 23, 2021 (CN) .......................... 202111620161.7

(51) Int. Cl.
    *G11C 29/00* (2006.01)
    *G11C 29/44* (2006.01)
    *G11C 29/02* (2006.01)
    *G11C 29/18* (2006.01)

(52) U.S. Cl.
    CPC ........ *G11C 29/4401* (2013.01); *G11C 29/022* (2013.01); *G11C 29/18* (2013.01); *G11C 29/785* (2013.01)

(58) Field of Classification Search
    CPC ... G11C 29/4401; G11C 29/022; G11C 29/18; G11C 29/785
    See application file for complete search history.

(56) References Cited

U.S. PATENT DOCUMENTS

| | | | |
|---|---|---|---|
| 9,875,815 B1* | 1/2018 | Bhargava | G11C 29/028 |
| 2006/0250864 A1 | 11/2006 | Hartmann | |
| 2019/0096505 A1* | 3/2019 | Lee | G11C 29/814 |
| 2021/0265002 A1* | 8/2021 | Noguchi | G11C 29/20 |
| 2021/0313004 A1* | 10/2021 | Goto | G11C 29/10 |

* cited by examiner

*Primary Examiner* — Christine T. Tu
(74) *Attorney, Agent, or Firm* — Syncoda LLC; Feng Ma

(57) ABSTRACT

A method for accessing a memory includes the following. Location information of fail bits of multiple banks is acquired, backup circuits are distributed to the target banks from the multiple banks according to the location information of the fail bits by using a repair algorithm, a predicted repair result of the target bank is acquired, the availability of the target bank is detected according to the predicted repair result of the target bank, information indicating whether bits of target partial address bits of the target banks are predicted to be valid or invalid is acquired, and then predicted partial address bits are determined from the multiple address bits according to the information of the target partial address bits of the target banks to access a memory in a partial access mode according to the predicted partial address bits.

20 Claims, 13 Drawing Sheets

METHOD AND APPARATUS FOR ACCESSING MEMORY, MEMORY, STORAGE DEVICE AND STORAGE MEDIUM

CROSS-REFERENCE TO RELATED APPLICATIONS

This application claims priority to Chinese Patent Application No. 202111620161.7 filed on Dec. 23, 2021, the disclosure of which is hereby incorporated by reference in its entirety.

BACKGROUND

Due to the deficiency of the process level of the early Dynamic Random Access Memory (DRAM) production line and the design level of DRAM products, the yield of the products is usually low. Even if wafers are used to produce the DRAM products, and some fail bits may be saved by repairing the DRAM products, there are still many DRAM products in which all the fail bits can be repaired, which causes that the number of good chips cannot reach a required product yield standard. Therefore, the number of the good chips produced at a whole wafer is too small to complete mass production.

The foregoing information disclosed in the background is merely for enhancement of the understanding of the background of the disclosure and therefore it may include information not constituting the prior art known to those of ordinary skill in the art.

SUMMARY

The disclosure relates to memory technologies, and in particular to a method and apparatus for accessing a memory, a memory, a storage device and a computer-readable storage medium.

In an aspect of the disclosure, a method for accessing a memory is provided. The memory includes: multiple banks, each of the multiple banks includes bits of multiple address bits, the multiple banks include fail bits, each of the multiple address bits includes at least two partial address bits. The method includes: acquiring location information of the fail bits in the multiple banks; distributing backup circuits to at least one target bank of the multiple banks according to the location information of the fail bits by using a repair algorithm, and acquiring a predicted repair result of the target bank; detecting availability of the target bank according to the predicted repair result of the target bank, and acquiring information of target partial address bits of the target bank, wherein partial address bits of the multiple address bits of the target bank comprise the target partial address bits; and determining predicted partial address bits from the multiple address bits according to the information of the target partial address bits of the target bank, to access the memory in a partial access mode according to the predicted partial address bits, wherein bits of the predicted partial address bits of each of the banks are predicted to be valid.

In another aspect of the disclosure, a memory is provided. The memory includes multiple banks, each of the multiple banks includes bits of multiple address bits, the multiple banks include fail bits, and each of the multiple address bits includes at least two partial address bits. The memory may be accessed by using any of the foregoing methods.

In another aspect of the disclosure, an apparatus for accessing a memory is provided. The memory includes multiple banks, each of the multiple banks includes bits of multiple address bits, the multiple banks include fail bits, and each of the multiple address bits includes at least two partial address bits. The device includes: an acquisition module, configured to acquire location information of the fail bits in the multiple banks; a repair module, configured to distribute backup circuits to at least one target bank of the multiple banks according to the location information of the fail bits by using a repair algorithm, and acquire a predicted repair result of the target bank; a bank detection module, configured to detect availability of the target bank according to the predicted repair result of the target bank, and acquire information of target partial address bits of the target bank, wherein partial address bits of the multiple address bits of the target bank comprise the target partial address bits, wherein the information of the target partial address bits of the target bank are configured to indicate whether bits of the target partial address bits of the target bank are predicted to be valid or invalid; and a memory prediction module, configured to determine predicted partial address bits from the multiple address bits according to the information of the target partial address bits of the target bank, to access a memory in a partial access mode according to the predicted partial address bits, wherein bits of the predicted partial address bits of each of the banks are predicted to be valid.

In another aspect of the disclosure, a storage device is provided. The storage device includes a memory, a processor, and executable instructions stored in the memory and may be executed in the processor. The processor is configured to implement any of the foregoing methods when the executable instructions are executed.

BRIEF DESCRIPTION OF THE DRAWINGS

The foregoing and other objectives, features and advantages of the disclosure will be further illustrated by describing exemplary embodiments thereof in detail with reference to the drawings.

DETAILED DESCRIPTION

Figure 1:
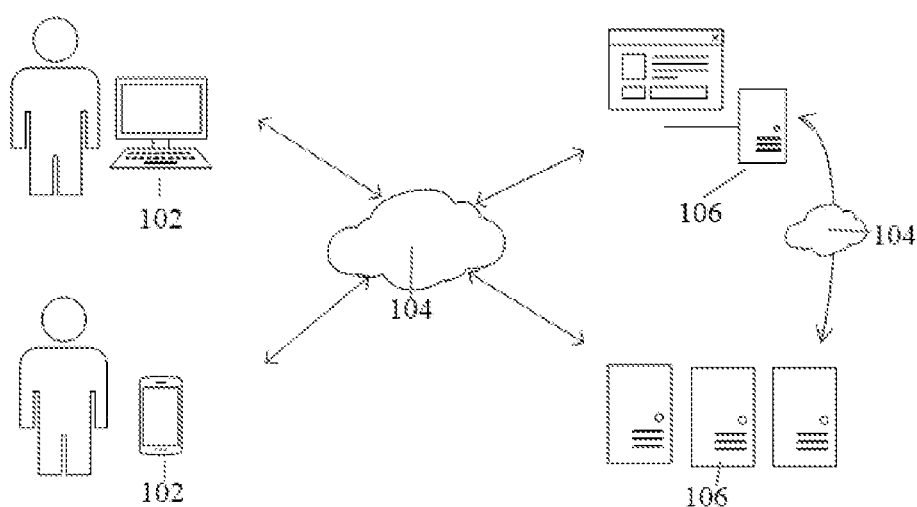
FIG. 1 illustrates a schematic diagram of a system structure according to an embodiment of the disclosure.

Exemplary embodiments will be described more comprehensively with reference to the drawings. However, the exemplary embodiments may be implemented in various forms, which are not intended to limit the disclosure. Rather, the embodiments are used to illustrate the disclosure more comprehensively and completely, and to make the idea of the exemplary embodiments comprehensively understood by those skilled in the art. The drawings are merely schematic diagrams of the disclosure and are not necessarily drawn to scale. Same reference numerals designate same or similar elements and therefore repeated descriptions thereof will be omitted.

Furthermore, the described features, structures or features may be incorporated in any suitable manner in one or more embodiments. In the following description, many specific details will be provided to give a full understanding of the embodiments of the disclosure. However, those skilled in the art should understand that the technical scheme of the disclosure may be implemented without one or more of the specific details or other methods, devices, steps and the like may be implemented. In other instances, well-known structures, methods, devices, implementations or operations will not be shown or described in detail to avoid overriding and obscuring the technical scheme of the disclosure in all aspects.

Furthermore, the terms "first", "second", etc. are merely used for description and should not be understood to indicate or imply relative importance or imply the number of technical features indicated. Therefore, a feature defined as "first," "second," may explicitly or implicitly include one or more of such features. In the description of the disclosure, "multiple" means at least two, e.g. two, three, etc. unless explicitly and specifically defined otherwise. The symbol "I" generally indicates that the related objects have an "or" relation.

Herein, unless explicitly specified and limited otherwise, terms such as "connected" should be understood in a broad sense such that, for example, related objects may be electrically connected or may communicate with each other; or they may be directly connected or indirectly connected through a medium. The specific meaning of the foregoing terms in the disclosure may be understood on a case-by-case basis by those of ordinary skill in the art.

In some implementations, a memory may be accessed in a partial mode. That is, merely partial bits of the whole memory are accessed, while the rest bits are turned off. However, when the partial mode is used for access, it cannot be quickly determined which bits of the memory are to be accessed, still resulting in low yield of the memory products.

In view of the above, how to quickly determine the valid part of the memory to improve the yield of the memory products has become an urgent problem to be solved.

As mentioned above, in some implementations, a partial mode is adopted to access a memory, partial bits in the whole memory are accessed, and the rest bits are turned off. For example, half of each bank may be selected to be accessed, and the other half will not be accessed. For example, a chip of 16 GB may be accessed in an 8 GB partial mode, i.e., the chip may become a qualified chip which can work at the expense of a partial capacity of 8 GB of the chip.

In this regard, the disclosure provides a method for accessing a memory. The method includes: the availability of target banks is detected according to predicted repair results of the target banks, information of target partial address bits indicating whether bits of the target partial address bits of the target banks are predicted to be valid or invalid is acquired, and then, predicted partial address bits are determined from multiple address bits according to the information of the target partial address bits of the target banks to access a memory in a partial access mode according to the predicted partial address bits, and thereby the bits accessed in the partial mode can be quickly determined, and the yield of memory products can be effectively improved.

FIG. 1 illustrates an exemplary system architecture 10 to which a method for accessing a memory or memory access device according to the disclosure may be applied.

As shown in FIG. 1, the system structure 10 may include a terminal device 102, a network 104, and a server 106. The terminal device 102 may be an electronic device having a display screen and supporting input and output, including but not limited to a smart phone, a tablet computer, a laptop portable computer, a desktop computer, a wearable device, a virtual reality device, a smart home, and the like. The network 104 serves as a medium to provide a communication link between the terminal device 102 and the server 106. The network 104 may include various types, such as wired and wireless communication links or fiber optic cables and the like. The server 106 may be a server or a cluster of servers providing various services, such as a background processing server a database server or the like.

A user may use the terminal device 102 to interact with the server 106 over the network 104 to receive or transmit data or the like. For example, the user downloads location information of fail bits of multiple banks of multiple memories from the server 106 over the network 104 to the terminal device 102, which may be taken as input information through repair software on the terminal device 102; and for example, the user may operate on the terminal device 102 to send predicted repair results of the target banks to the server 106 over the network 104 through the bank detection software on the terminal device 102, so that the server 106 can detect the availability of the target banks according to the predicted repair results of the target banks.

It should be understood that the number of terminal devices, networks and servers shown in FIG. 1 is merely illustrative. According to the implementation requirements, the terminal devices, networks and servers of any number may be provided.

Figure 2:
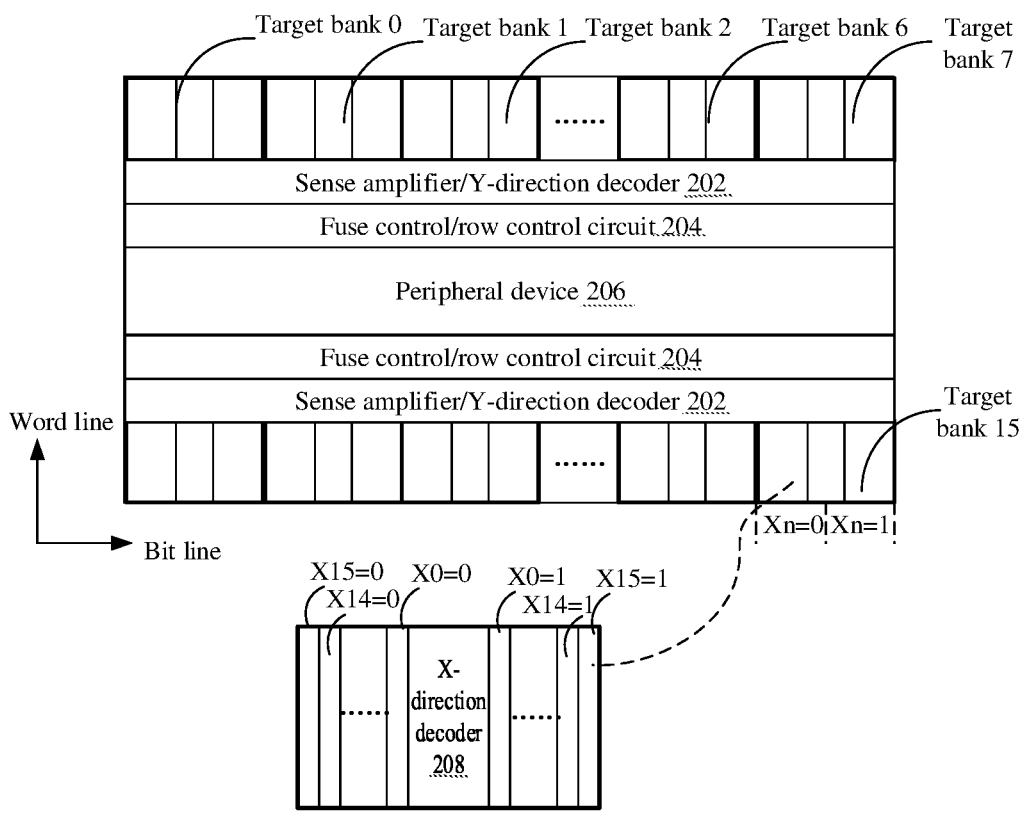
FIG. 2 illustrates a schematic structural diagram of a memory according to an exemplary embodiment.

FIG. 2 illustrates a schematic structural diagram of a memory according to an exemplary embodiment. A method according to an embodiment of the disclosure may be implemented when the memory shown in FIG. 2 is accessed. As shown in FIG. 2, the memory may include multiple banks, each bank may serve as a target bank. For example, the memory shown in FIG. 2 includes 16 banks such as target bank 0, target bank 1, target bank 2 . . . target bank 6, target bank 7 . . . target bank 15, etc.

Each of the multiple banks may include bits of multiple address bits $X_n$, n may be an integer larger than or equal to 0. Each of the multiple address bits may include at least two partial address bits, for example, an address bit $X_n$ may include a word line with a first partial address bit $X_n=0$ and a word line with a first partial address bit $X_n=1$, and the word lines of the banks are perpendicular to the direction of bit lines. As shown in FIG. 2, taking the target bank 15 as an example, the target bank 15 may include 16 address bits such as X0, X1 . . . X14, X15, etc. Each address bit may include two partial address bits, such as the address bit X0 including the partial address bits X0=0 and X0=1, the address bit X14 including the partial address bits X14=0 and X14=1, the address bit X15 including the partial address bits X15=0 and X15=1, etc. 0 and 1 may be bit flags. A X-direction decoder 208 may be arranged between bits of the partial address bits with the bit flag 0 and bits of the partial address bits with the bit flag 1.

According to some embodiments, for each of multiple banks, two partial address bits of each address bit of each bank have equal bit capacities.

According to some embodiments, X address bits may be set as a basis for selecting a partial access mode, such as setting an address bit X15=0, indicating that for address bit X15, only the partial address bit X15=0 of the address bit X15 is accessed when a memory is accessed.

The multiple banks may include fail bits. According to some embodiments, each target bank may include fail bits to be repaired by using a repair algorithm.

The memory may further include a sense amplifier/Y-direction decoder 202, a fuse control/row control circuit 204, and a peripheral 206 configured to perform operations of accessing the memory such as reading/writing.

Figure 3:
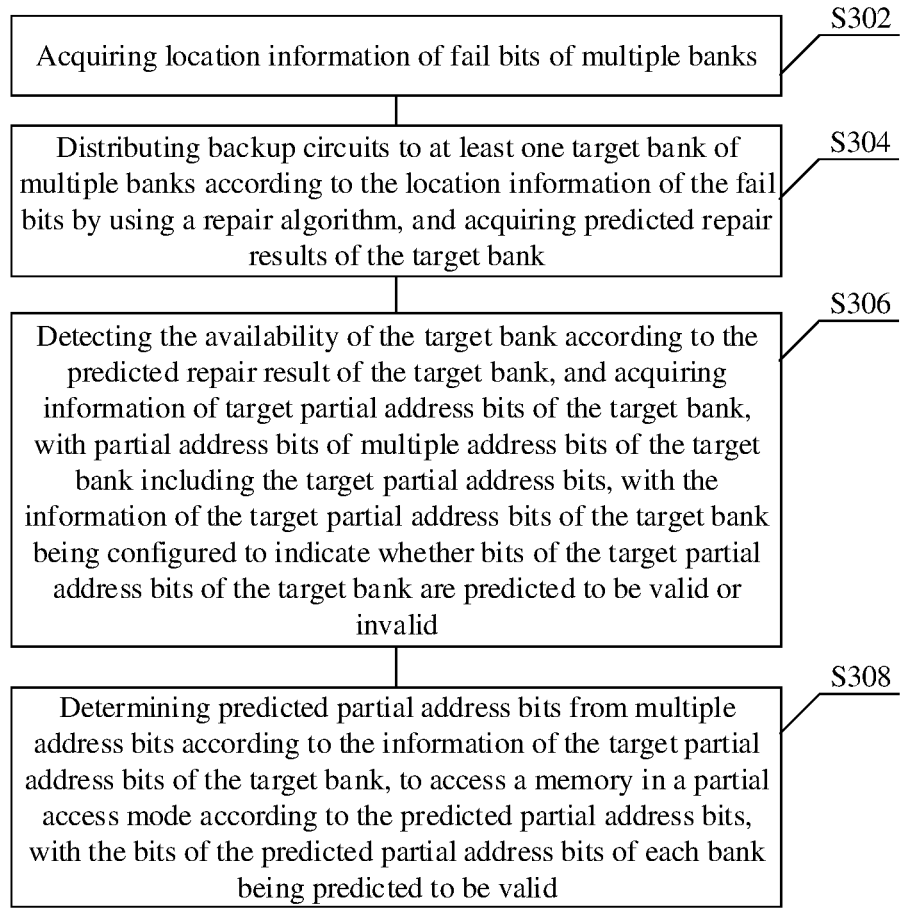
FIG. 3 illustrates a flow diagram of a method for accessing a memory according to an embodiment of the disclosure.

FIG. 3 illustrates a flow diagram of a method for accessing a memory according to an exemplary embodiment. The method shown in FIG. 3 may be applied, for example to access the memory shown in FIG. 2 and may be implemented by the terminal device and/or the server of the system shown in FIG. 1.

With reference to FIG. 3, the method 30 according to the embodiment of the disclosure may include the following steps.

At step S302, location information of fail bits of multiple banks is acquired.

According to some embodiments, location information of fail bits of all memory chips generated by a wafer tester may be acquired, thereby acquiring location information of fail bits of each bank of each memory.

At step S304, backup circuits are distributed to at least one target bank of multiple banks according to the location information of the fail bits by using a repair algorithm, and a predicted repair result of the target bank is acquired.

Figure 4:
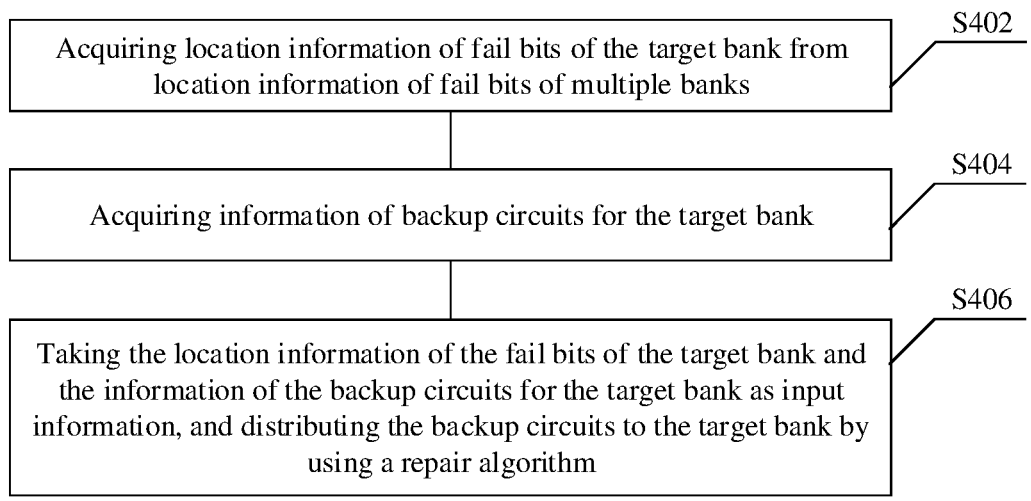
FIG. 4 illustrates a schematic diagram of the processing procedures of the step S304 shown in FIG. 3 according to an embodiment.
Figure 5:
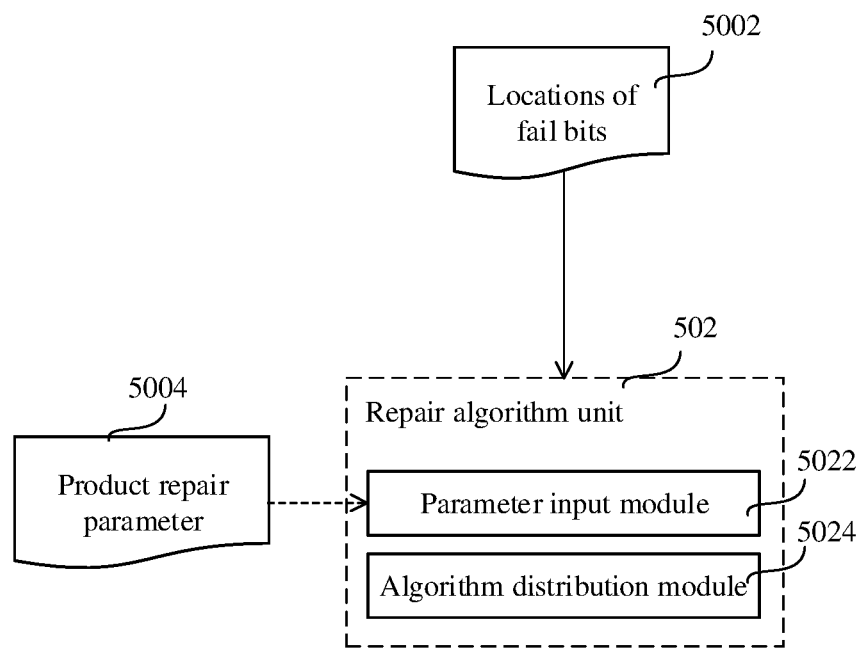
FIG. 5 illustrates a schematic diagram of implementing a bank repair method shown in FIGS. 3 and 4.

According to some embodiments, a repair algorithm unit is modularized, and location information of fail bits of the target bank are input into the repair algorithm unit, and then predicted repair result of the target bank is output, specific implementations of which may refer to FIG. 4 and FIG. 5.

At step S306, the availability of the target bank is detected according to the predicted repair result of the target bank, and information of target partial address bits of the target bank is acquired, with partial address bits of multiple address bits of the target bank including the target partial address bits.

According to some embodiments, information of target partial address bits of target bank is configured to indicate whether bits of the target partial address bits of the target bank are predicted to be valid or invalid.

Figure 6:
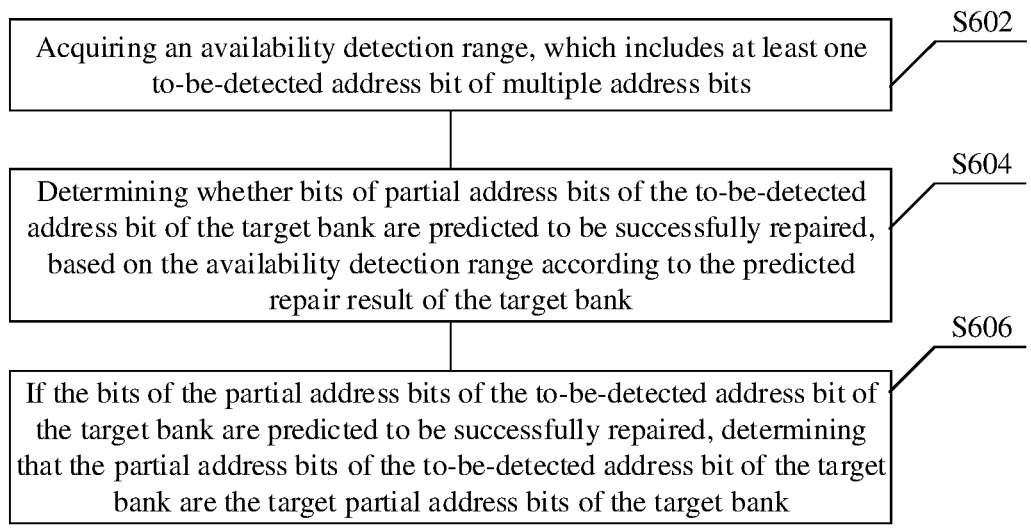
FIG. 6 illustrates a schematic diagram of the processing procedures of the step S306 shown in FIG. 3 according to an embodiment.
Figure 7:
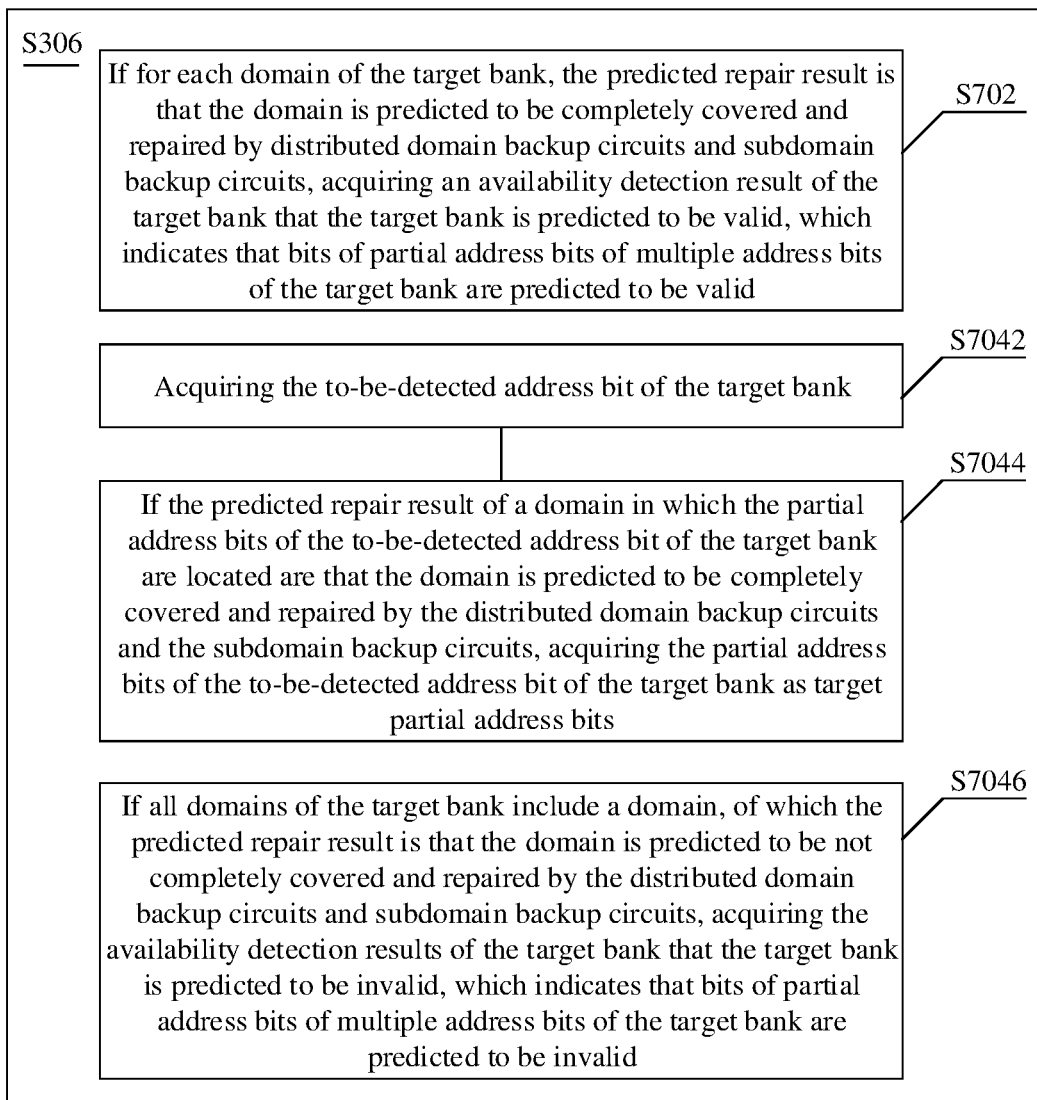
FIG. 7 illustrates a schematic diagram of the processing procedures of the step S306 shown in FIG. 3 based on FIG. 4 according to another embodiment.
Figure 8:
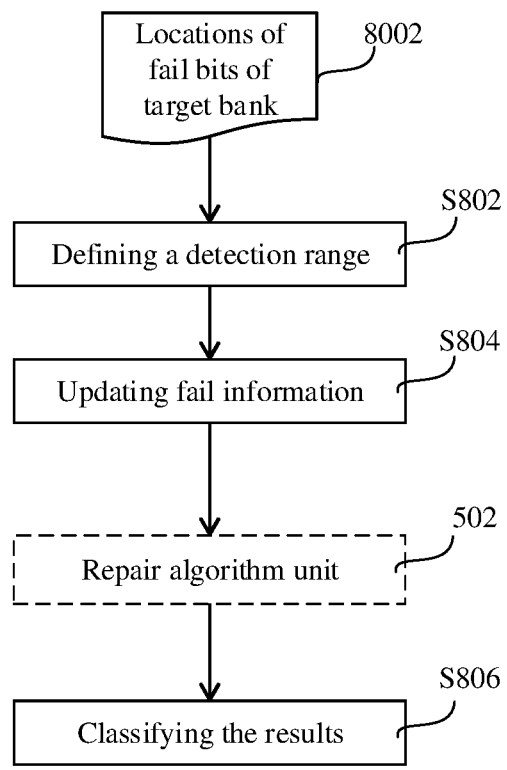
FIG. 8 illustrates a schematic diagram of implementing a bank repair method shown in FIG. 3 to FIG. 7.

According to some embodiments, in case of multiple target banks, the availability of the target banks is detected sequentially by using the target bank availability detection algorithm (e.g. by a method shown in FIG. 8), i.e., whether the bits of the address bits are repairable is detected, the specific implementations of which may refer to FIG. 6 to FIG. 8.

At step S308, predicted partial address bits are determined from multiple address bits according to the information of the target partial address bits of the target bank, to access a memory in a partial access mode according to the predicted partial address bits, with the bits of the predicted partial address bits of each bank being predicted to be valid.

Figure 9:
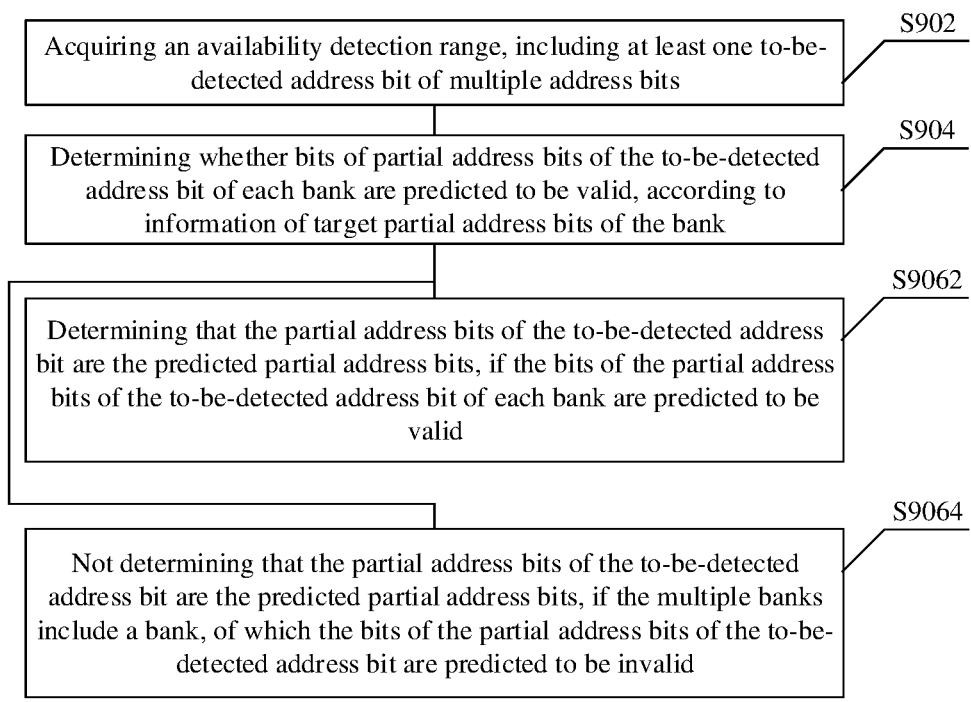
FIG. 9 illustrates a schematic diagram of the processing procedures of the step S308 shown in FIG. 3 according to an embodiment.
Figure 10:
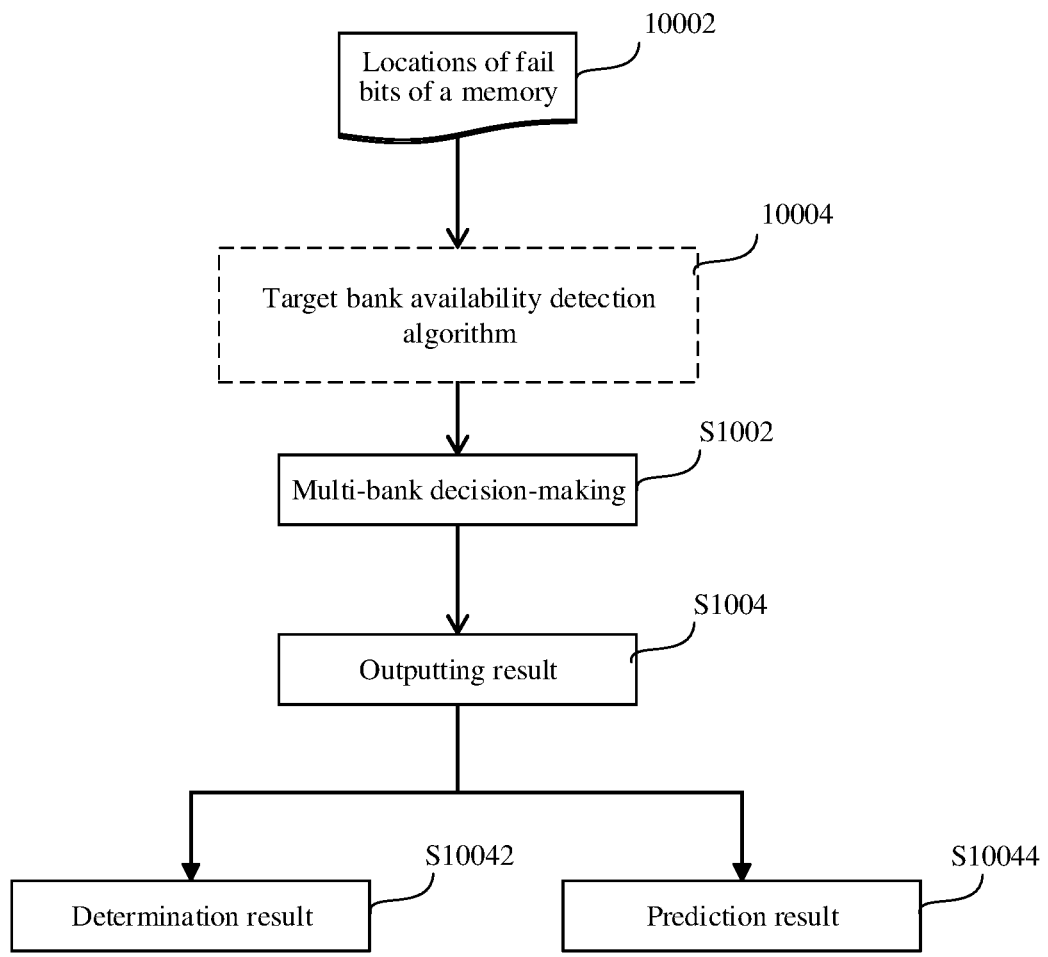
FIG. 10 illustrates a schematic diagram of implementing a bank repair method shown in FIG. 3 to FIG. 9.

According to some embodiments, for example, whether bits of partial address bits in an availability detection range are predicted to be valid may be determined based on information of target partial address bits of target bank according to the defined availability detection range, to determine predicted partial address bits from multiple address bits, the specific implementations of which may refer to FIG. 9 to FIG. 10.

Figure 11:
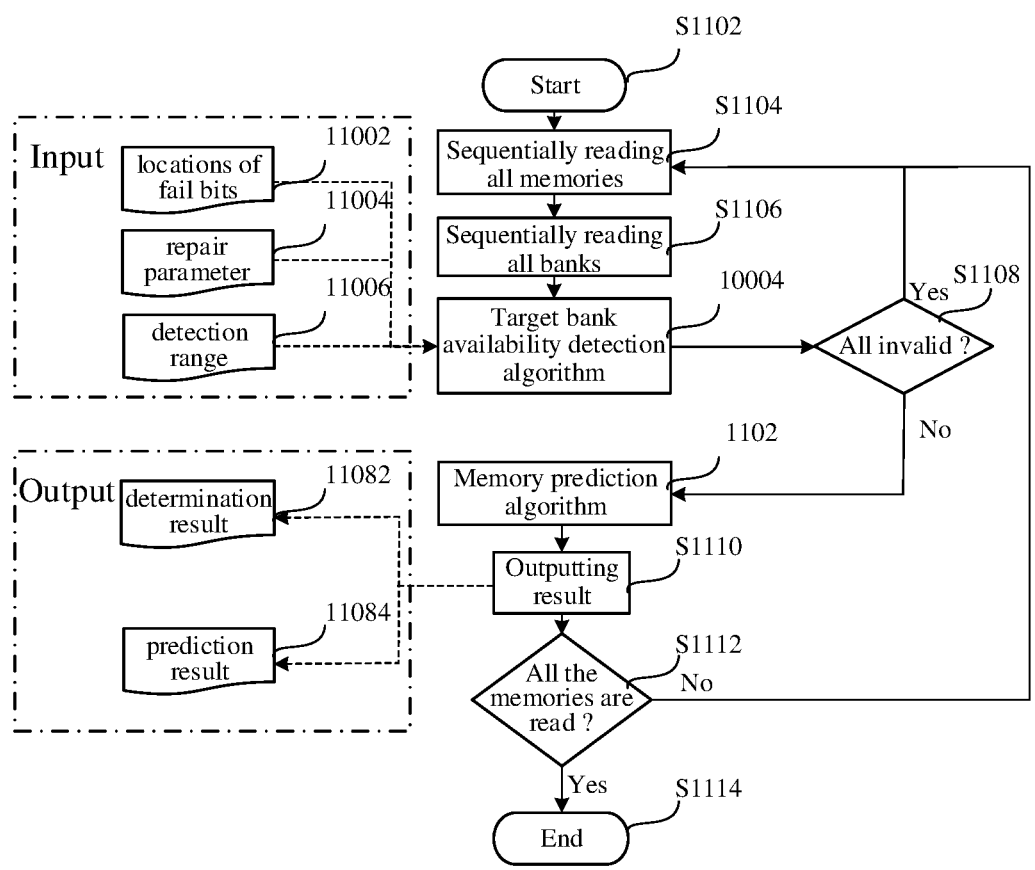
FIG. 11 illustrates a schematic flow diagram of a memory partial access mode prediction method shown in FIG. 3 to FIG. 10.

According to some embodiments, all banks of a memory may serve as target banks, and may be sequentially processed according to steps S306 and S308 to acquire predicted partial address bits and to acquire all the predicted partial address bits of the memory, the specific implementations of which may refer to FIG. 11.

In the method for accessing the memory according to the embodiments of the disclosure: location information of fail bits of multiple banks is acquired; backup circuits are distributed to at least one target bank of multiple banks according to the location information of the fail bits by using a repair algorithm, and a predicted repair result of the target bank is acquired; availability of the target bank is detected according to the predicted repair result of the target bank, and information of target partial address bits indicating whether bits of the target partial address bits of the target bank are predicted to be valid or invalid is acquired; and predicted partial address bits are determined from multiple address bits according to the information of the target partial address bits of the target bank, to access a memory in a partial access mode according to the predicted partial address bits, so that the part to be accessed in the partial mode can be quickly determined, and the yield of memory products can be effectively improved.

The method for accessing a memory according to the embodiments of the disclosure can quickly determine whether a current unrepairable memory chip can be upgraded to a qualified chip by being accessed in a partial mode, and can effectively improve the product yield, and can further predict the potential partial mode configuration of the current product and effectively reduce the research and development cost.

FIG. 4 illustrates a schematic diagram of a processing procedure of the step S304 shown in FIG. 3 according to an embodiment. As shown in FIG. 4, according to the embodiment of the disclosure, the step S304 may further include the following steps. The steps shown in FIG. 4 may be executed by using a repair algorithm unit 502 shown in FIG. 5.

At step S402, location information of fail bits of at least one target bank is acquired from location information of fail bits of multiple banks.

At step S404, information of backup circuits for the target bank is acquired.

According to some embodiments, the target bank may include multiple domains and each domain may include multiple subdomains; and the backup circuits may include domain backup circuits and subdomain backup circuits, and information of the backup circuits for the target bank may include the number of the domain backup circuits for the target bank and the number of subdomain backup circuits for the target bank. With reference to FIG. 5, for example, the number of the domain backup circuits for the target bank and the number of the subdomain backup circuits for the target bank may be input to a repair algorithm unit 502 as a product repair parameter 5004.

According to some embodiments, repair rule(s) corresponding to a memory, such as co-repair and cross-region repair rules may be acquired, which may be input to a repair algorithm unit 502 as a product repair parameter 5004.

At step S406, the location information of the fail bits of the target bank and the information of the backup circuits of the target bank are taken as input information, and the backup circuit is distributed to the target bank by using a repair algorithm.

According to some embodiments, location information of fail bits of the target bank, information of backup circuits for the target bank and repair rule(s) corresponding to a memory may be taken as input information, and the backup circuits are distributed to the target bank by using a repair algorithm. The repair algorithm is an algorithm which can effectively distribute the backup circuits to completely cover the locations of the fail bits. For example, the location information of the fail bits of the target bank, the number of domain backup circuits and the number of subdomain backup circuits for the target bank may be taken as the input information, the domain backup circuits and the subdomain backup circuits are distributed to the target bank by using the repair algorithm, and a predicted repair result of each domain of the target bank is acquired. The predicted repair result of the domain includes: the domain being predicted to be completely covered and repaired by the distributed domain backup circuits and subdomain backup circuits, i.e., the fail bits of the domain being successfully and completely covered and repaired by the limited backup circuits, and the domain being a valid domain; or the domain being predicted to be not completely covered and repaired by the distributed domain backup circuits and subdomain backup circuits, and the domain being an invalid domain, and a target bank to which an invalid domain belong may be further defined as an invalid bank.

FIG. 5 illustrates a schematic diagram of implementing a bank repair method shown in FIG. 3 and FIG. 4. As shown in FIG. 5, a repair algorithm unit 502 may include an input parameter module 5022 and a distribution algorithm module 5024. Due to the fact that the distribution process of each domain and subdomain of any bank will not affect other domains and subdomains, each bank may be independently and successively processed by the distribution algorithm module 5024 for distribution of backup circuits.

The input parameter module 5022 may be configured to acquire a product repair parameter 5004, which may include the number of the domain backup circuits for the target banks and the number of the subdomain backup circuits for the target banks shown in FIG. 4, and the repair rules corresponding to the memory in which the target banks are located. The distribution algorithm module 5024 may be configured to acquire locations of fail bits 5002 and then the domain backup circuits and the subdomain backup circuits are distributed to the target banks by using the repair algorithm, to acquire the predicted repair results of domains of the target banks.

FIG. 6 illustrates a schematic diagram of the processing procedure of the step S306 shown in FIG. 3 according to an embodiment. As shown in FIG. 6, according to the embodiment of the disclosure, the step S306 may further include the following steps.

At step S602, an availability detection range is acquired, which includes at least one to-be-detected address bit of multiple address bits.

According to some embodiments, with reference to FIG. 2 for example, an availability detection range being a to-be-detected address bit X15 including partial address bits of the address bit, which for example, may include two to-be-detected partial address bits X15=0 and X15=1, may be acquired according to a specific detection location, X15 for example, input by a user.

According to other embodiments, for example, a location detection range for availability of the partial access mode that is desired to be predicted may be input by a user. With reference to FIG. 2, a detection range may be, for example, multiple address bits from X0-X15, such as X0, X14, X15, or X3-X10, etc.

At step S604, it is determined whether bits of partial address bits of the to-be-detected address bits of the target bank are predicted to be successfully repaired, according to the predicted repair result of the target bank based on the availability detection range.

According to some embodiments, whether bits of partial address bits of to-be-detected address bits of target bank are predicted to be successfully repaired may be determined based on whether the to-be-detected address bits belong to valid domains in the predicted repair result of the target bank, the specific implementations of which may refer to FIG. 7.

At step S606, it is determined that the partial address bits of the to-be-detected address bits of the target bank are the target partial address bits of the target bank, if the bits of the partial address bits of the to-be-detected address bits of the target bank are predicted to be successfully repaired.

According to some embodiments, if bits of partial address bits of to-be-detected address bits of target bank are not predicted to be successfully repaired, the partial address bits of the to-be-detected address bits of the target bank are not determined to be the target partial address bits of the target bank, and the judgment of a next to-be-detected address bit in the availability detection range is continued.

FIG. 7 illustrates a schematic diagram of a processing procedure of the step S306 shown in FIG. 3 based on FIG. 4 according to another embodiment. As shown in FIG. 7, according to the embodiment of the disclosure, the step S306 may further include the following steps.

At step S702, when for each domain of the target bank, a predicted repair result is that the domain is predicted to be completely covered and repaired by distributed domain backup circuits and subdomain backup circuits, an availability detection result of the target bank that the target bank is predicted to be valid is acquired, which indicates that bits of partial address bits of multiple address bits of the target bank are predicted to be valid.

According to some embodiments, if the whole target bank is repairable, then res=0 may be added to a destination file, which may include availability detection results acquired in step S806 shown in FIG. 8, e.g. [0], which indicates that bits of partial address bits of each address bit of the target bank are predicted to be valid (i.e. repairable, accessible).

At step S7042, a to-be-detected address bit of the target bank is acquired.

At step S7044, if a predicted repair result of a domain in which the partial address bits of the to-be-detected address bit of the target bank are located are that the domain is predicted to be completely covered and repaired by the distributed domain backup circuits and the subdomain backup circuits, target partial address bits are acquired as the partial address bits of the to-be-detected address bit of the target bank.

According to some embodiments, if part of the whole target bank is repairable, whether a domain in which partial address bits of to-be-detected address bit are located is valid (i.e. repairable) may be determined according to predicted repair result, and if yes, the partial address bits of the to-be-detected address bit are determined to be repairable target partial address bits. For example, if partial address bit X15=0 is determined to be repairable, then res=150 may be added to a destination file, otherwise it is not added; if partial address bit X15=1 is determined to be repairable, then res=151 may be added to the destination file, otherwise it is not added; and for example, if partial address bit X14=0 is determined to be repairable, then res=140 is added to the destination file, otherwise it is not added; and if partial address bit X14=1 is determined to be repairable, then res=141 is added to the destination file, otherwise it is not added. The destination file may include availability detection results acquired in step S806 shown in FIG. 8, for example [150], [0], and [141].

At step S706, if for each domain of the target bank, the predicted repair result is that the domain is predicted to be not completely covered and repaired by the distributed domain backup circuits and subdomain backup circuits, availability detection results of the target bank that the target bank is predicted to be invalid are acquired, which indicates that bits of partial address bits of multiple address bits of the target banks are predicted to be invalid.

According to some embodiments, if the whole target bank is unrepairable, then res=−1 may be added to a destination file, which may include availability detection results acquired in step S806 shown in FIG. 8, e.g. [−1], which indicates that bits of partial address bits of each address bit of the target bank are predicted to be invalid (i.e. unrepairable, inaccessible).

FIG. 8 illustrates a schematic diagram of implementing a bank detection method shown in FIG. 3 to FIG. 7. As shown in FIG. 8, the method includes the following steps: for each target bank, given that locations of fail bits of the to-be-detected target bank 8002 are acquired, firstly, an availability detection range is defined (S802), the specific implementations of which may refer to step S602; then fail information (S804) is updated, the availability detection range is traversed, backup circuits and fail bits used in the last repair during each detection are restored to truly detect the repairability of the current detection, and when the whole bank is repairable, the fail information is not updated; then, the backup circuits are distributed by using a repair algorithm unit 502 to acquire the predicted repair result of the target bank, the specific implementations may refer to FIG. 4 and FIG. 5; and then, the availability detection result of the target bank is acquired according to the predicted repair result, with an acquired availability detection destination file including the following contents: [0], [−1] and [Xn+0/1], the specific implementations of which may refer to FIG. 7.

FIG. 9 illustrates a schematic diagram of a processing procedure of the step S308 shown in FIG. 3 according to an embodiment. As shown in FIG. 9, each of multiple banks of a memory is a target bank which has been subjected to availability detection. As shown in FIG. 9, according to the embodiment of the disclosure, the step S308 may further include the following steps.

At step S902, an availability detection range is acquired, including at least one to-be-detected address bit of multiple address bits.

According to some embodiments, the step of acquiring an availability detection range may refer to the step S602, and the at least one to-be-detected address bit in the availability detection range may be at least one candidate address bit of predicted partial address bits of each bank of a memory.

At step S904, it is determined whether bits of partial address bits of the to-be-detected address bit of each bank are predicted to be valid, according to information of target partial address bit of each bank.

At step S9062, if the bits of the partial address bits of the to-be-detected address bit of each bank are predicted to be valid, it is determined that the partial address bits of the to-be-detected address bit are the predicted partial address bits.

At step S9064, if the multiple banks include a bank, of which the bits of the partial address bits of the to-be-detected address bits are predicted to be invalid, it is not determined that the partial address bits of the to-be-detected address bit are the predicted partial address bits.

According to some embodiments, with reference to FIG. 2, for example, a to-be-detected address bit is X15, a destination file acquired by processing each bank with a bank detection algorithm as shown in FIG. 8 is traversed. With reference to FIG. 7, if the destination file of the m-th (m being a positive integer) bank, i.e., bank (m) includes 150, it indicates that the part X15=0 can be enabled (i.e. the bit X15=0 of the bank (m) is predicted to be valid), and res_bank (m)=1 is acquired; and if the destination file of the bank (m) includes 0, it indicates that the part X15=0 can be enabled, and res_bank (m)=1 is acquired; otherwise, the part X15=0 of the bank (m) cannot be enabled, and res_bank (m)=0 is acquired.

Then, the results res of the banks of the memory may be subjected to AND operation. If the result of the AND operation is equal to 1, it indicates that the part X15=0 of the memory can be enabled, and the partial address bits of the to-be-detected address bit are determined to be the predicted partial address bits; and if the result of the AND operation is equal to 0, it indicates that the part X15=0 of the memory cannot be enabled, and the partial address bits of the to-be-detected address bit are not determined to be the predicted partial address bits.

FIG. 10 illustrates a schematic diagram of implementing a bank repair method shown in FIG. 3 to FIG. 9. As shown in FIG. 10, firstly, location information of fail bits of a memory is input 10002, each bank of the memory is subjected to a target bank availability detection algorithm 10004 to acquire detection results as acquired in the step S806 shown in FIG. 8, multi-bank decision-making shown in FIG. 9 is performed (S1002), and a prediction result of the memory is output (S1004).

Herein, a judgment result (S10042) and a prediction result (S10044) may be acquired from the prediction result of the memory. According to the judgment result (S10042), whether the part at a specific detection location selected by a user (for example, a bit X15=0) can be enabled is determined based on an input detection range, which may specifically refer to the prediction method shown in FIG. 9. If yes, the "part X15=0 can be enabled successfully" is output as a judgment result; and if not, the "part bit X15=0 cannot be enabled successfully" is output as a judgment result.

The prediction range (e.g. X0-X14) may be sequentially traversed to acquire the prediction result (S10044), the availability detection result res_bank (m) of each bank <X0=0> is sequentially determined, and the AND operation is performed to determine whether part <X0=0> of the memory can be enabled; the availability detection result res_bank (m) of each bank <X0=1> is sequentially determined, and the AND operation is performed to acquire the enable result of the part <X0=1> of the memory; the availability detection result res_bank (m) of each bank <X1=0> is sequentially determined, and AND operation is performed to acquire the enable result of the part <X1=0> of the memory; and the availability detection result res_bank (m) of each bank <X1=1> is sequentially determined, and AND operation is performed to acquire the enable result of the part <X1=1> of the memory; and to X14 in a similar fashion, the partial enable configuration prediction of the memory is outputted, which may be, for example, X15=0, X13=1, X2=1, i.e. the partial address bits are predicted partial address bits of the memory.

FIG. 11 illustrates a schematic flow diagram of a method for predicting a partial access mode of a memory shown in FIG. 3 to FIG. 10. The method for predicting the partial access mode of the memory shown in FIG. 11 may include the following steps.

At step S1102, the process begins.

At step S1104, all memories are read sequentially, for example, a current memory chip 0 is read.

At step S1106, all banks of the current memory are read sequentially, and an availability detection result of each bank is acquired by using a target bank availability detection algorithm 10004 (with reference to FIG. 8) according to the input locations of fail bits 11002, a repair parameter 11004, and a detection range 11006. For example, a current bank, e.g., bank 0 of the current memory chip 0 is read and the bank 0 is processed by using the target bank availability detection algorithm 10004 to acquire an availability detection result of the bank 0.

At step S1108, it is determined whether the current memory is wholly invalid (unrepairable) according to the availability detection results of each bank of the current memory, if yes, it returns to step S1104, a next memory is read, for example, a memory chip 1 next to the memory chip 0 is read; and if not, a memory prediction algorithm 1102 is used (with reference to FIG. 10).

At step S1110, a memory prediction result is output, which may include a judgment result 11082 and a prediction result 11084. The prediction result 11084 may be, for example: partial enable configuration prediction of the chip 0: X15=0, X13=1, and X2=1; and partial enable configuration prediction of the chip 1: X15=0, X12=1, and X4=0.

At step S1112, it is determined whether all the memories are read, if not, it returns to step S1104 to read a next memory, and if yes, the process ends (S11104), for example, if a current memory is a chip 0, it is determined whether there is a chip 1, if yes, the reading is not finished, and it returns to step S1104 to read the next memory, and if the reading is finished, the process ends (S11104).

According to the method according to embodiments of the disclosure, a backup circuit algorithm is modularized, and combined with a bank availability detection algorithm and a memory prediction algorithm to form a complete set of decision-making and prediction algorithm for the partial enable configuration of bits of a chip, so as to help a user quickly decide whether the currently selected specific detection location may be configured as the partial mode configuration, and then make an unqualified chip become a qualified chip through the partial mode. The potential partial mode configuration of the current product is predicted by inputting a detection range, and the partial enable result achieved by repairing of a current product line may provide a certain reference for the design of the partial mode for the next generation of products.

In the case of poor yield, the method according to the embodiments of the disclosure can help quickly decide the partial mode configuration and turn the unrepairable chips into qualified chips through the partial mode, thereby greatly improving the yield of the products. Meanwhile, DRAM factories can make the best use of the chips and greatly reduce production costs.

Figure 12:
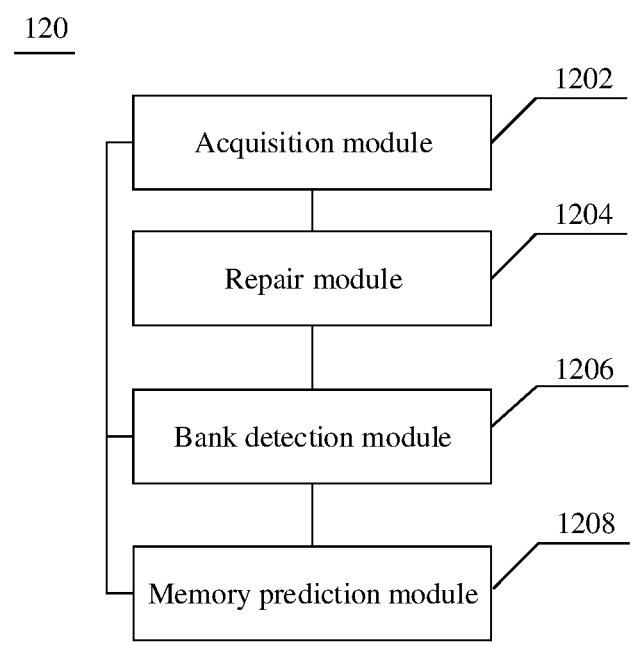
FIG. 12 illustrates a block diagram of a memory access device according to an embodiment of the disclosure.

FIG. 12 illustrates a block diagram of an apparatus for accessing a memory according to an exemplary embodiment. For example, the apparatus shown in FIG. 12 may be applied to access the memory shown in FIG. 2 and may be implemented by the terminal device and/or the server of the system shown in FIG. 1.

With reference to FIG. 12, the device 120 according to the embodiment of the disclosure may include an acquisition module 1202, a repair module 1204, a bank detection module 1206 and a memory prediction module 1208.

The acquisition module 1202 may be configured to acquire location information of fail bits in multiple banks.

The repair module 1204 may be configured to distribute backup circuits to at least one target bank of the multiple banks according to the location information of the fail bits by using a repair algorithm, and acquire a predicted repair result of the target bank.

The repair module 1204 may be further configured to acquire location information of fail bits in the target bank from the location information of the fail bits in the multiple banks; acquire information of the backup circuits for the target bank; and take the location information of the fail bits in the target bank and the information of the backup circuits for the target bank as input information, and distribute the backup circuits to the target bank by using the repair algorithm.

The repair module 1204 may be further configured to acquire at least one repair rule corresponding to a memory; and to take the location information of the fail bits in the target bank, the information of the backup circuits for the target bank and the repair rule corresponding to the memory as the input information, and distribute the backup circuits to the target bank by using the repair algorithm.

The repair module 1204 may be further configured to take the location information of the fail bits in the target bank and the number of the domain backup circuits and the number of the subdomain backup circuits for the target bank as the input information, distributing the domain backup circuits and the subdomain backup circuits to the target bank by using the repair algorithm, and acquire a predicted repair result of each domain of the target bank. The predicted repair result of each domain includes: the domain being predicted to be completely covered and repaired by the distributed domain backup circuits and the subdomain backup circuits, or the domain being predicted to be not completely covered and repaired by the distributed domain backup circuits and subdomain backup circuits.

The bank detection module 1206 may be configured to detect availability of the target bank according to the predicted repair result of the target bank, and acquire information of target partial address bits of the target bank, wherein partial address bits of the multiple address bits of the target bank comprise the target partial address bits, wherein the information of the target partial address bits of the target bank are configured to indicate whether bits of the target partial address bits of the target bank are predicted to be valid or invalid.

The bank detection module 1206 may further configured to acquire an availability detection range, with the availability detection range including at least one to-be-detected address bit of multiple address bits; determine whether bits of the partial address bits of the to-be-detected address bit of the target bank are predicted to be successfully repaired, based on the availability detection range according to the predicted repair result of the target bank; and to determine that the partial address bits of the to-be-detected address bit of the target bank are the target partial address bits of the target bank, in response to the bits of the partial address bits of the to-be-detected address bit of the target bank being predicted to be successfully repaired.

The bank detection module 1206 may be further configured to acquire an availability detection result of the target bank that the target bank is predicted to be valid, which indicates that the bits of the partial address bits of the multiple address bits of the target bank are predicted to be valid, in response to each domain of the target bank being predicted to be completely covered and repaired by the distributed domain backup circuits and subdomain backup circuits.

The bank detection module 1206 may be further configured to acquire at least one to-be-detected address bit of the target bank; and acquire the partial address bits of the to-be-detected address bit of the target bank as the target partial address bits, in response to a domain in which the partial address bits of the to-be-detected address bit of the target bank are located being predicted to be completely covered and repaired by the distributed domain backup circuits and subdomain backup circuits.

The bank detection module 1206 may be further configured to acquire an availability detection result of the target bank that the target bank is predicted to be invalid, which indicates that the bits of the partial address bits of the multiple address bits of the target bank are predicted to be invalid, in response to the target bank including a domain that is predicted to be not completely covered and repaired by the distributed domain backup circuits and subdomain backup circuits.

The memory prediction module 1208 may be configured to configured to determine predicted partial address bits from the multiple address bits according to the information of the target partial address bits of the target bank, to access a memory in a partial access mode according to the predicted partial address bits, wherein bits of the predicted partial address bits of each of the banks are predicted to be valid.

The memory prediction module 1208 may be further configured to acquire an availability detection range, including at least one to-be-detected address bit of multiple address bits; determine whether the bits of the partial address bits of the to-be-detected address bit of each of the banks are predicted to be valid, according to the information of the target partial address bits of the target bank; and determine that the partial address bits of the to-be-detected address bit are the predicted partial address bits, in response to the bits of the partial address bits of the to-be-detected address bit of each of the banks being predicted to be valid.

The memory prediction module 1208 may be further configured to not determine that the partial address bits of the to-be-detected address bit are the predicted partial address bits, in response to the multiple banks comprising a bank, of which bits of partial address bits of the to-be-detected address bit are predicted to be invalid.

The specific implementation of each module of the device according to the embodiment of the disclosure may refer to those of the foregoing methods, which are not repeated herein.

Figure 13:
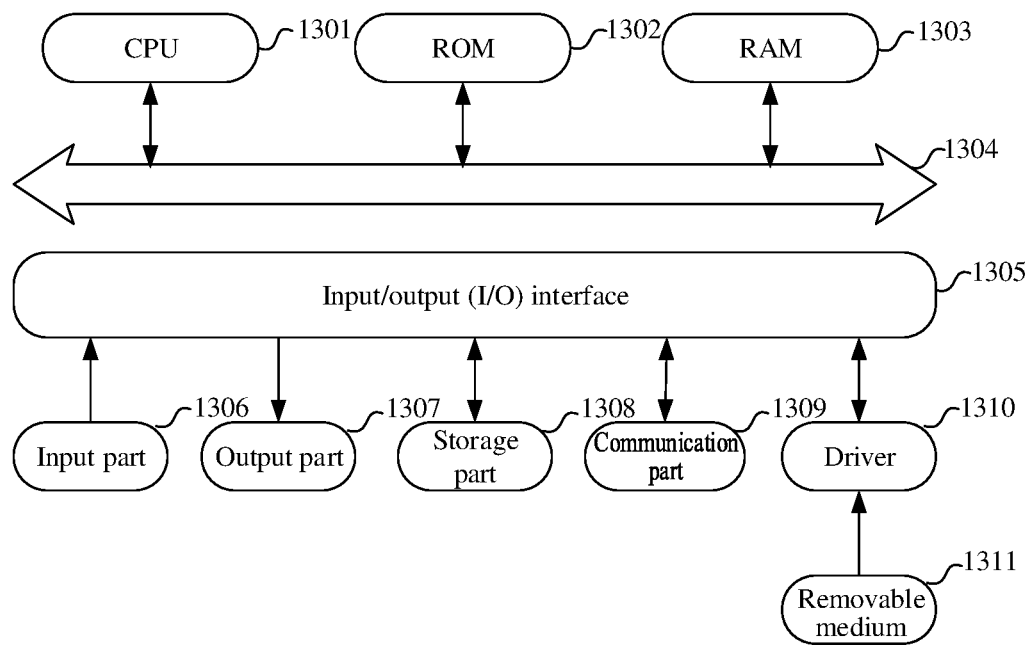
FIG. 13 illustrates a schematic structural diagram of an electronic device according to an embodiment of the disclosure.

FIG. 13 illustrates a schematic structural diagram of a storage device according to an embodiment of the disclosure. It should be noted that the device shown in FIG. 13 is merely an example of a computer system, which should not limit the functions and scope of use of the device according to the embodiments of the disclosure.

As shown in FIG. 13, the device 1300 includes a CPU (Central Processing Unit) 1301, which may execute various appropriate actions and processes according to programs stored in a ROM (Read Only Memory) 1302 or programs loaded into a RAM (Random Access Memory) 1303 from a storage part 1308. In the RAM 1303, various programs and data required for the operation of the device 1300 are further stored. The CPU 1301, the ROM 1302, and the RAM 1303 are connected to each other through a bus 1304. An input/output (I/O) interface 1305 is further connected to the bus 1304.

Components connected to the I/O interface 1305 include: an input part 1306 including a keyboard, a mouse and the like; an output part 1307 including a CRT (Cathode Ray Tube), a LCD (Liquid Crystal Display) and a speaker or the like; a storage part 1308 including a hard disk or the like; and a communication part 1309 including a NIC (Network Interface Card) such as a LAN (Local Area Network) card, a modem and the like. The communication part 1309 executes communication processing via a network such as the Internet. A driver 1310 is further connected to the I/O interface 1305 as required. A removable medium 1311 such as a magnetic disk, an optical disk, a magneto-optical disk, a semiconductor memory and the like is installed on the drive 1310 as required, so that the computer programs read therefrom are installed into the storage part 1308 as required.

Specifically, according to the embodiments of the disclosure, the process described above with reference to the flow diagram may be implemented as a computer software program. For example, an embodiment of the disclosure provides a computer program product, including a computer program in a computer-readable medium, which includes program codes configured to execute the method shown in the flow diagram. According to the embodiment, the computer program may be downloaded and installed from the network through the communication part 1309 and/or installed from the removable medium 1311. When the computer program is executed by the CPU 1301, the functions defined in the system of the disclosure are implemented.

It should be noted that the computer-readable medium provided by the disclosure may be a computer-readable signal medium or a computer-readable storage medium or any combination thereof. The computer-readable storage medium may be, for example, but is not limited to, electrical, magnetic, optical, electromagnetic, infrared, or semiconductor systems, devices, and apparatuses or any combination thereof. More specifically, the computer-readable storage medium may be, but is not limited to: an electrical connection having one or more wires, a portable computer disk, a hard disk, a RAM, a ROM, an EPROM (Erasable Programmable Read-only Memory) or flash memory, an optical fiber, a CD-ROM (Compact Disc Read-only Memory), an optical memory device, a magnetic memory device, or any suitable combination thereof. According to the disclosure, the computer-readable storage medium may be any tangible medium having or storing programs which may be executed by or in conjunction with an instruction execution system, apparatus, or device. According to the disclosure, the computer-readable signal medium may include data signals propagated in a baseband or as part of a carrier wave, in which computer-readable program codes are carried. The propagated data signals may be of a variety of forms including but not limited to electromagnetic signals, optical signals or any suitable combination thereof. The computer-readable signal medium may further be any computer-readable medium other than the computer-readable storage medium which may send, propagate, or transmit the programs for use by or in conjunction with the instruction execution system, apparatus, or device. The program codes in the computer-readable medium may be transmitted through any suitable medium, including but not limited to a wireless wire, a fiber, an optic cable, RF etc. or any suitable combination thereof.

The flow diagrams and block diagrams in the drawings illustrate the structures, functions and operations of possible implementations of systems, methods and computer program products according to the embodiments of the disclosure. In this regard, each block in each flow diagram or block diagram may represent a module, program segment, or part of codes including one or more executable instructions configured to implement a specified logical function. It should further be noted that, in some alternative implementations, the functions indicated in the blocks may be further performed in a different order than those indicated in the drawings. For example, two blocks represented in succession may actually be executed substantially in parallel or sometimes they may be executed in a reverse order, which depends on the related functions. It should be further noted that each block in each block diagram or flow diagram, and a combination of blocks in each block diagram or flow diagram, may be implemented in a dedicated hardware-based system which implement a specified function or operation, or may be implemented in a combination of dedicated hardware and computer instructions.

The modules described according to the embodiments of the disclosure may be implemented in a software manner or in a hardware manner. The described modules may be further arranged in the processor, for example, may be described as an acquisition module, a repair module, a bank detection module, and a memory prediction module. The names of the modules do not limit the modules in some cases. For example, the acquisition module may further be described as "the module for acquiring location information of fail bits".

In another aspect, the disclosure further provides a computer-readable medium which may be included in the device described according to the foregoing embodiments, or may further exist alone and not be assembled into the device. The computer-readable medium carries one or more programs, and when the one or more programs are executed by the device, the steps executed by the device include:

acquiring location information of fail bits of multiple banks; adopting a repair algorithm to distribute backup circuits to the target banks from the multiple banks according to the location information of the fail bits, and acquiring predicted repair results of the target banks; detecting the availability of the target banks according to the predicted repair results of the target banks, acquiring information of target partial address bits of the target banks, with partial address bits of multiple address bits of the target banks including the target partial address bits, and the information of the target partial address bits of the target banks being configured to indicate whether bits of the target partial address bits of the target banks are predicted to be valid or invalid; and determining predicted partial address bits from the multiple address bits according to the information of the target partial address bits of the target banks to access a memory in a partial access mode according to the predicted partial address bits, with bits of the predicted partial address bits of each bank being predicted to be valid.

The exemplary embodiments of the disclosure are specifically illustrated and described above. It should be understood that the disclosure is not limited to the detailed structure, setting modes or implementations described herein. Rather, the disclosure is intended to include various modifications and equivalent settings defined by the spirit and scope of the claims.

What is claimed is:

1. A method for accessing a memory, wherein the memory comprises multiple banks, each of the multiple banks comprises bits of multiple address bits, the multiple banks comprise fail bits, and each of the multiple address bits comprises at least two partial address bits, the method comprising:

acquiring location information of the fail bits in the multiple banks;

distributing backup circuits to at least one target bank of the multiple banks according to the location information of the fail bits by using a repair algorithm, and acquiring a predicted repair result of the target bank;

detecting availability of the target bank according to the predicted repair result of the target bank, and acquiring information of target partial address bits of the target bank, wherein partial address bits of the multiple address bits of the target bank comprise the target partial address bits; and determining predicted partial address bits from the multiple address bits according to the information of the target partial address bits of the target bank, to access the memory in a partial access mode according to the predicted partial address bits, wherein bits of the predicted partial address bits of each of the banks are predicted to be valid.

2. The method of claim 1, further comprising:

acquiring an availability detection range, wherein the availability detection range comprises at least one to-be-detected address bit of the multiple address bits; and wherein detecting the availability of the target bank according to the predicted repair result of the target bank, comprises:

determining whether bits of the partial address bits of the to-be-detected address bit of the target bank are predicted to be successfully repaired, based on the availability detection range according to the predicted repair result of the target bank; and determining that the partial address bits of the to-be-detected address bit of the target bank are the target partial address bits of the target bank, in response to the bits of the partial address bits of the to-be-detected address bit of the target bank being predicted to be successfully repaired.

3. The method of claim 1, wherein distributing backup circuits to at least one target bank of the multiple banks according to the location information of the fail bits by using the repair algorithm, comprises:

acquiring location information of fail bits in the target bank from the location information of the fail bits in the multiple banks;

acquiring information of the backup circuits for the target bank; and taking the location information of the fail bits in the target bank and the information of the backup circuits for the target bank as input information, and distributing the backup circuits to the target bank by using the repair algorithm.

4. The method of claim 3, wherein distributing backup circuits to at least one target bank of the multiple banks according to the location information of the fail bits by using the repair algorithm, further comprises:
acquiring at least one repair rule corresponding to the memory; and
wherein taking the location information of the fail bits in the target bank and the information of the backup circuits for the target bank as input information, and distributing the backup circuits to the target bank by using the repair algorithm, comprises:
taking the location information of the fail bits in the target bank, the information of the backup circuits for the target bank and the repair rule corresponding to the memory as the input information, and distributing the backup circuits to the target bank by using the repair algorithm.

5. The method of claim 3, wherein the target bank comprises multiple domains, and each domain comprises multiple subdomains;
the backup circuits comprise domain backup circuits and subdomain backup circuits, and the information of the backup circuits for the target bank comprises a number of the domain backup circuits for the target bank and a number of subdomain backup circuits for the target bank; and
wherein distributing backup circuits to at least one target bank of the multiple banks according to the location information of the fail bits by using the repair algorithm and acquiring the predicted repair result of the target bank, comprises:
taking the location information of the fail bits in the target bank and the number of the domain backup circuits and the number of the subdomain backup circuits for the target bank as the input information, distributing the domain backup circuits and the subdomain backup circuits to the target bank by using the repair algorithm, and acquiring a predicted repair result of each domain of the target bank,
wherein the predicted repair result of each domain comprises:
the domain being predicted to be completely covered and repaired by the distributed domain backup circuits and the subdomain backup circuits, or
the domain being predicted to be not completely covered and repaired by the distributed domain backup circuits and subdomain backup circuits.

6. The method of claim 5, wherein detecting availability of the target bank according to the predicted repair result of the target bank and acquiring information of target partial address bits of the target bank, comprises:
acquiring an availability detection result of the target bank that the target bank is predicted to be valid, which indicates that the bits of the partial address bits of the multiple address bits of the target bank are predicted to be valid, in response to each domain of the target bank being predicted to be completely covered and repaired by the distributed domain backup circuits and subdomain backup circuits.

7. The method of claim 5, wherein detecting availability of the target bank according to the predicted repair result of the target bank and acquiring information of target partial address bits of the target bank, comprises:
acquiring at least one to-be-detected address bit of the target bank; and
acquiring the partial address bits of the to-be-detected address bit of the target bank as the target partial address bits, in response to a predicted repair result of a domain in which the partial address bits of the to-be-detected address bit of the target bank are located being that the domain is predicted to be completely covered and repaired by the distributed domain backup circuits and subdomain backup circuits.

8. The method of claim 5, wherein detecting availability of the target bank according to the predicted repair result of the target bank and acquiring information of target partial address bits of the target bank, comprises:
acquiring an availability detection result of the target bank that the target bank is predicted to be invalid, which indicates that the bits of the partial address bits of the multiple address bits of the target bank are predicted to be invalid, in response to the target bank including a domain that is predicted to be not completely covered and repaired by the distributed domain backup circuits and subdomain backup circuits.

9. The method of claim 1, further comprising:
acquiring an availability detection range, wherein the availability detection range comprises at least one to-be-detected address bit of the multiple address bits,
wherein the at least one target bank comprises all of the multiple banks; and
wherein determining the predicted partial address bits from the multiple address bits according to the information of target partial address bits of the target bank, comprises:
determining whether the bits of the partial address bits of the to-be-detected address bit of each of the banks are predicted to be valid, according to the information of the target partial address bits of the target bank; and
determining that the partial address bits of the to-be-detected address bit are the predicted partial address bits, in response to the bits of the partial address bits of the to-be-detected address bit of each of the banks being predicted to be valid.

10. The method of claim 9, wherein determining the predicted partial address bits from the multiple address bits according to the information of target partial address bits of the target bank, further comprises:
not determining that the partial address bits of the to-be-detected address bit are the predicted partial address bits, in response to the multiple banks comprising a bank, of which bits of partial address bits of the to-be-detected address bit are predicted to be invalid.

11. The method of claim 1, wherein each of the multiple address bits comprises two partial address bits, and for the multiple banks, the two partial address bits of each address bit have a same bit capacity.

12. A memory, comprising multiple banks, wherein each of the multiple banks comprises bits of multiple address bits, the multiple banks comprise fail bits, each of the multiple address bits comprises at least two partial address bits, and the memory is accessed by using the method of claim 1.

13. A storage device, comprising: a memory, a processor, and executable instructions stored in the memory and executed in the processor, wherein the memory comprises multiple banks, each of the multiple banks comprises bits of multiple address bits, the multiple banks comprise fail bits, and each of the multiple address bits comprises at least two partial address bits, and wherein the processor is configured to:
acquire location information of the fail bits in the multiple banks;
distribute backup circuits to at least one target bank of the multiple banks according to the location information of the fail bits by using a repair algorithm, and acquire a predicted repair result of the target bank;

detect availability of the target bank according to the predicted repair result of the target bank, and acquiring information of target partial address bits of the target bank, wherein partial address bits of the multiple address bits of the target bank comprise the target partial address bits; and determine predicted partial address bits from the multiple address bits according to the information of the target partial address bits of the target bank, to access the memory in a partial access mode according to the predicted partial address bits, wherein bits of the predicted partial address bits of each of the banks are predicted to be valid.

14. The storage device of claim 13, wherein the processor is further configured to:

acquire an availability detection range, wherein the availability detection range comprises at least one to-be-detected address bit of the multiple address bits; and wherein in detecting the availability of the target bank according to the predicted repair result of the target bank, the processor is configured to:

determine whether bits of the partial address bits of the to-be-detected address bit of the target bank are predicted to be successfully repaired, based on the availability detection range according to the predicted repair result of the target bank; and determine that the partial address bits of the to-be-detected address bit of the target bank are the target partial address bits of the target bank, in response to the bits of the partial address bits of the to-be-detected address bit of the target bank being predicted to be successfully repaired.

15. The storage device of claim 13, wherein in order to distribute backup circuits to at least one target bank of the multiple banks according to the location information of the fail bits by using the repair algorithm, the processor is configured to:

acquire location information of fail bits in the target bank from the location information of the fail bits in the multiple banks;

acquire information of the backup circuits for the target bank; and take the location information of the fail bits in the target bank and the information of the backup circuits for the target bank as input information, and distribute the backup circuits to the target bank by using the repair algorithm.

16. The storage device of claim 15, wherein in order to distribute backup circuits to at least one target bank of the multiple banks according to the location information of the fail bits by using the repair algorithm, the processor is further configured to:

acquire at least one repair rule corresponding to the memory; and wherein in order to take the location information of the fail bits in the target bank and the information of the backup circuits for the target bank as input information, and distribute the backup circuits to the target bank by using the repair algorithm, the processor is configured to:

take the location information of the fail bits in the target bank, the information of the backup circuits for the target bank and the repair rule corresponding to the memory as the input information, and distribute the backup circuits to the target bank by using the repair algorithm.

17. The storage device of claim 15, wherein the target bank comprises multiple domains, and each domain comprises multiple subdomains;

the backup circuits comprise domain backup circuits and subdomain backup circuits, and the information of the backup circuits for the target bank comprises a number of the domain backup circuits for the target bank and a number of subdomain backup circuits for the target bank; and wherein in order to distribute backup circuits to at least one target bank of the multiple banks according to the location information of the fail bits by using the repair algorithm and acquire the predicted repair result of the target bank, the processor is configured to:

take the location information of the fail bits in the target bank and the number of the domain backup circuits and the number of the subdomain backup circuits for the target bank as the input information, distribute the domain backup circuits and the subdomain backup circuits to the target bank by using the repair algorithm, and acquire a predicted repair result of each domain of the target bank, wherein the predicted repair result of each domain comprises:

the domain being predicted to be completely covered and repaired by the distributed domain backup circuits and the subdomain backup circuits, or the domain being predicted to be not completely covered and repaired by the distributed domain backup circuits and subdomain backup circuits.

18. The storage device of claim 17, wherein in order to detect availability of the target bank according to the predicted repair result of the target bank and acquire information of target partial address bits of the target bank, the processor is configured to:

acquire an availability detection result of the target bank that the target bank is predicted to be valid, which indicates that the bits of the partial address bits of the multiple address bits of the target bank are predicted to be valid, in response to each domain of the target bank being predicted to be completely covered and repaired by the distributed domain backup circuits and subdomain backup circuits.

19. The storage device of claim 17, wherein in order to detect availability of the target bank according to the predicted repair result of the target bank and acquiring information of target partial address bits of the target bank, the processor is configured to:

acquire at least one to-be-detected address bit of the target bank; and acquire the partial address bits of the to-be-detected address bit of the target bank as the target partial address bits, in response to a predicted repair result of a domain in which the partial address bits of the to-be-detected address bit of the target bank are located being that the domain is predicted to be completely covered and repaired by the distributed domain backup circuits and subdomain backup circuits.

20. A non-transitory computer-readable storage medium, wherein computer-executable instructions are stored in the computer-readable storage medium, and the executable instructions, when executed by a processor, implement a method for accessing a memory, comprising:

acquiring location information of the fail bits in the multiple banks;

distributing backup circuits to at least one target bank of the multiple banks according to the location information of the fail bits by using a repair algorithm, and acquiring a predicted repair result of the target bank;

detecting availability of the target bank according to the predicted repair result of the target bank, and acquiring information of target partial address bits of the target bank, wherein partial address bits of the multiple address bits of the target bank comprise the target partial address bits; and determining predicted partial address bits from the multiple address bits according to the information of the target partial address bits of the target bank, to access the memory in a partial access mode according to the predicted partial address bits, wherein bits of the predicted partial address bits of each of the banks are predicted to be valid.

* * * * *